United States Patent
Wu

(10) Patent No.: US 10,855,316 B2
(45) Date of Patent: *Dec. 1, 2020

(54) ERROR CORRECTION CODE (ECC) OPERATIONS IN MEMORY

(71) Applicant: Micron Technology, Inc., Boise, ID (US)

(72) Inventor: Yingquan Wu, Palo Alto, CA (US)

(73) Assignee: Micron Technology, Inc., Boise, ID (US)

( * ) Notice: Subject to any disclaimer, the term of this patent is extended or adjusted under 35 U.S.C. 154(b) by 6 days.

This patent is subject to a terminal disclaimer.

(21) Appl. No.: 16/220,491

(22) Filed: Dec. 14, 2018

(65) Prior Publication Data
US 2019/0123768 A1 Apr. 25, 2019

Related U.S. Application Data

(63) Continuation of application No. 15/195,308, filed on Jun. 28, 2016, now Pat. No. 10,177,793.

(51) Int. Cl.
*H03M 13/00* (2006.01)
*H03M 13/29* (2006.01)
*H03M 13/11* (2006.01)
*H03M 13/15* (2006.01)

(52) U.S. Cl.
CPC ..... *H03M 13/611* (2013.01); *H03M 13/2906* (2013.01); *H03M 13/2927* (2013.01); *H03M 13/6561* (2013.01); *H03M 13/1102* (2013.01); *H03M 13/152* (2013.01)

(58) Field of Classification Search
CPC .................................................. H03M 13/611
USPC ........................................................ 714/755
See application file for complete search history.

(56) References Cited

U.S. PATENT DOCUMENTS

| | | | |
|---|---|---|---|
| 10,423,345 B2 * | 9/2019 | d'Abreu | G06F 11/1056 |
| 2009/0282316 A1 | 11/2009 | Lingam et al. | |
| 2012/0089884 A1 | 4/2012 | Kamiya et al. | |
| 2013/0173982 A1 | 7/2013 | Moon et al. | |
| 2015/0301887 A1 * | 10/2015 | Zhang | H03M 13/1102 714/764 |
| 2015/0339186 A1 * | 11/2015 | Sharon | H03M 13/1108 714/760 |
| 2016/0378400 A1 * | 12/2016 | Yang | G06F 3/0616 711/156 |
| 2017/0102993 A1 | 4/2017 | Hu et al. | |
| 2017/0255517 A1 * | 9/2017 | Achtenberg | G06F 3/0619 |
| 2018/0067666 A1 * | 3/2018 | d'Abreu | G06F 3/0619 |

(Continued)

OTHER PUBLICATIONS

Blaum, et al. "Partial-MDS Codes and Their Application to RAID Type of Architectures", IEEE Transactions on Information Theory, vol. 59, No. 7, Jul. 2013, pp. 4510-4519.

(Continued)

*Primary Examiner* — Fritz Alphonse
(74) *Attorney, Agent, or Firm* — Brooks, Cameron & Huebsch, PLLC

(57) ABSTRACT

Apparatuses and methods for performing an error correction code (ECC) operation are provided. One example method can include generating a codeword based on a number of low density parity check (LDPC) codewords failing a LDPC decoding operation and performing a BCH decoding operation on the codeword.

20 Claims, 3 Drawing Sheets

(56) References Cited

U.S. PATENT DOCUMENTS

2018/0091172 A1* 3/2018 Ilani .................. H03M 13/2927
2019/0068219 A1* 2/2019 Bhatia .................. G11C 29/42

OTHER PUBLICATIONS

Abdel-Ghaffar, et al. "Multilevel Error-Control Codes for Data Storage Channels", IEEE Transactions on Information Theory, vol. 37, No. 3, May 1991, pp. 735-741.

Hassner, et al. "Integrated Interleaving—A Novel ECC Architecture", IEEE Transactions on Magnetics, vol. 37, No. 2, Mar. 2001, pp. 773-775.

Tang, et al. "A Novel Method for Combining Algebraic Decoding and Iterative Processing", IEEE International Symposium on Information Theory, Seattle, WA, USA, Jul. 2006, pp. 474-478.

Blaum, et al. "Generalized Concatenated Types of Codes for Erasure Correction", <http://arxiv.org/abs/1406.6270>, San Jose, CA, USA, Jul. 10, 2014, 28 pp.

Tang, et al. "On the Performance of Integrated Interleaving Coding Schemes", IEEE International Symposium on the Information Theory, Chicago, IL, USA, 2002, pp. 267-271.

Maucher, et al. "On the Equivalence of Generalized Concatenated Codes and Generalized Error Location Codes", IEEE Transaction on Information Theory, vol. 46, No. 2, Mar. 2000, pp. 642-649.

McEliece, et al. "On the Decoder Error Probability for Reed-Solomon Codes". IEEE Transactions on Information Theory, vol. 32, No. 5, Sep. 1986, pp. 701-703.

Wu "New List Decoding Algorithms for Reed-Solomon and BCH Codes", IEEE Transactions on the Information Theory, vol. 54, No. 8, Aug. 2008, 3611-3630.

* cited by examiner

ERROR CORRECTION CODE (ECC) OPERATIONS IN MEMORY

PRIORITY INFORMATION

This Application is a Continuation of U.S. application Ser. No. 15/195,308, filed Jun. 28, 2016, the specification of which is incorporated herein by reference.

TECHNICAL FIELD

The present disclosure relates generally to memory devices, and more particularly, to apparatuses and methods for error correction.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAIVI), resistive random access memory (RRAM), and magnetoresistive random access memory (MRAM), among others.

Memory devices can be combined together to form a storage volume of a memory system such as a solid state drive (SSD). A solid state drive can include non-volatile memory (e.g., NAND flash memory and NOR flash memory), and/or can include volatile memory (e.g., DRAM and SRAM), among various other types of non-volatile and volatile memory.

An SSD can be used to replace hard disk drives as the main storage volume for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

DETAILED DESCRIPTION

Figure 1:
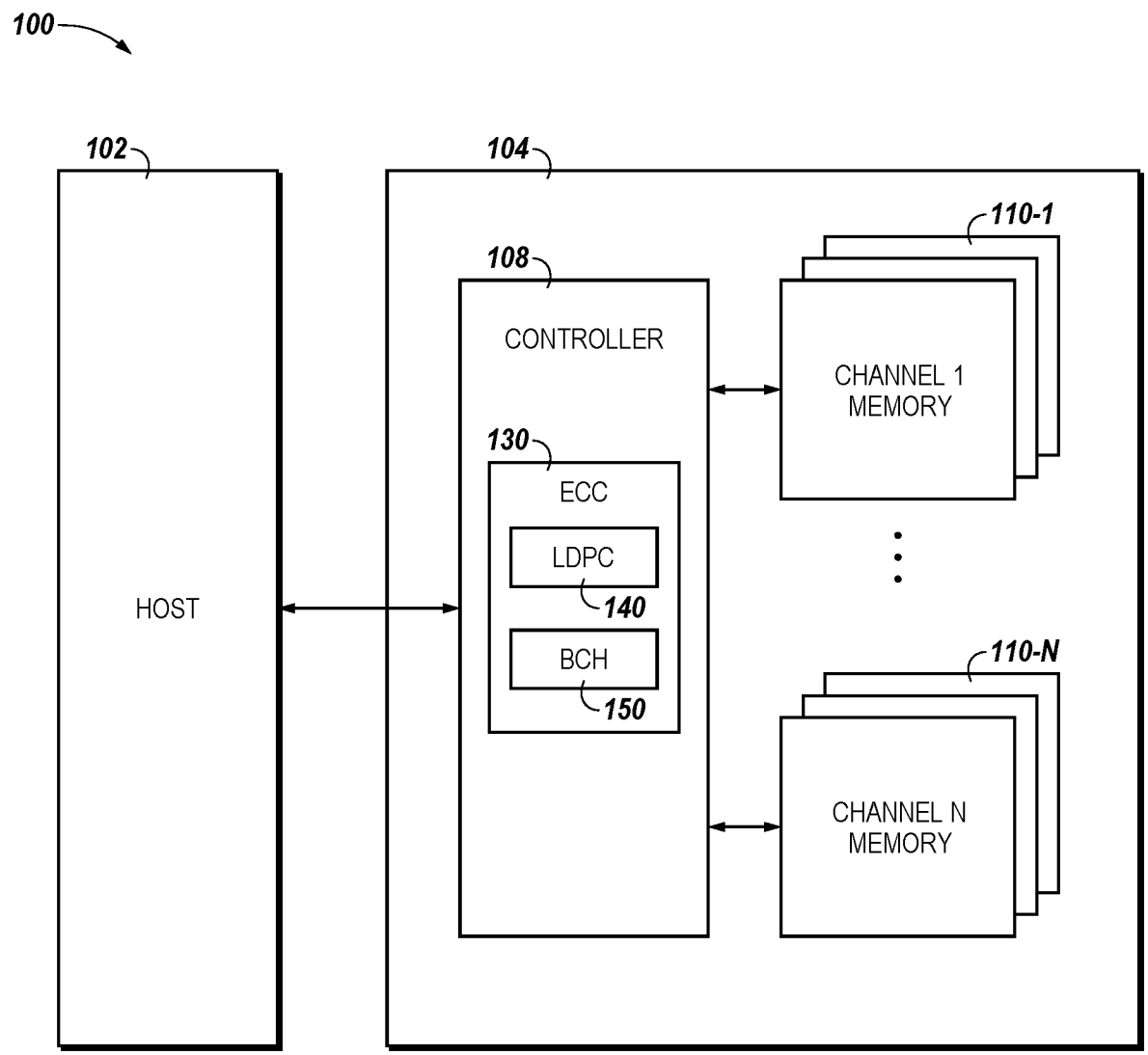
FIG. 1 is a block diagram of an apparatus in the form of a computing system including a memory system in accordance with a number of embodiments of the present disclosure.

Apparatuses and methods for performing an error correction code (ECC) operation are provided. One example method can include generating a codeword based on a number of low density parity check (LDPC) codewords failing a LDPC decoding operation and performing a BCH decoding operation on the codeword.

In one or more embodiments of the present disclosure, a controller can be configured to execute a number of LDPC decoding operations on the number of LDPC codewords. When only one LDPC codeword fails the LDPC decoding operations and the rest of the LDPC codewords pass the LDPC decoding operations, a BCH decoding operation is executed. The BCH decoding operation uses a BCH codeword formed based on the LDPC codeword and BCH parity bits to correct errors associated with an uncorrectable LDPC codeword that failed the LDPC decoding operations.

In a number of embodiments, the overall error floor of the LDPC decoding operations and the BCH decoding operation can be below 1E-12. Error floors of LDPC codes can be due to trapping sets. A trapping set is a set of variable nodes which induces a subgraph with odd-degree check nodes and an arbitrary number of even-degree check nodes.

In one or more embodiments, each 1KB LDPC codeword can have an error floor greater than 1E-12 and less than 3E-7. This error floor can occur as a result of a column weight of 4 and a code rate below 0.95, for example. The correction power of the BCH decoding operation (t) is greater than or equal to 8 and less than or equal to 12 when using a column weight of 4. By concatenating the number of LDPC codewords with the BCH parity bits, the probability of at least two LDPC codewords simultaneously falling into trapping sets with up to t variable nodes is bounded by $(_2^4)(3*10^{-7})^{-13} = 5.4*10^{-13}$. Therefore the overall error floor of the LDPC decoding operations and the BCH decoding operation is dropped below 1E-12.

In previous approaches, a BCH decoding operation was executed to correct each codeword that failed a LDPC operation. However, in a number of embodiments, the overall error floor of the LDPC decoding operations and the BCH decoding operation is dropped below 1E-12. When, only 1 in 4 codewords fail LDPC decoding operations. This results in a BCH decoding operation only being executed to correct 1 in 4 codewords. Therefore the overall BCH overhead is reduced by 4 times and encoder/decoder circuitry can be reduced. For example, forming a BCH codeword based on summation of 4 LDPC codewords with 1KB user data length, the 1 KB BCH can be 14-bits and includes a number of BCH parity bits that is 14 times the correction power of the BCH decoding operation, whereas the 4KB BCH code for 4KB user data used in previous approaches includes 16-bits and 16 t BCH parity bits.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N" indicates that a number of the particular feature so designated can be included with a number of embodiments of the present disclosure.

As used herein, "a number of" something can refer to one or more of such things. For example, a number of memory devices can refer to one or more of memory devices. Additionally, designators such as "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a functional block diagram of a computing system 100 including an apparatus in the form of at least one memory system 104, in accordance with one or more embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. In the embodiment illustrated in FIG. 1, the memory system 104 can include a controller 108 and one or more memory devices 110-1, . . . , 110-N. In this example, the controller 108 is external to the one or more memory devices 110-1, . . . , 110-N. The memory devices 110-1, . . . , 110-N can provide a storage volume for the memory system, e.g., with a file system formatted to the memory devices. In a number of embodiments, the number of memory devices 110-1, . . . , 110-N can include non-volatile memory including a number of logical units (LUNs). A LUN can be a portion of non-volatile memory that can be independently controllable. The controller 108 can include control circuitry, e.g., hardware, firmware, and/or software. In one or more embodiments, the controller 108 can be an application specific integrated circuit (ASIC) coupled to a printed circuit board including a physical interface and memory devices 110-1, . . . , 110-N. Also, the controller can include volatile and/or non-volatile memory.

The controller 108 can include hardware, firmware, and/or software to perform ECC operations on data, e.g., to correct errors in the data. For example, errors in the state of a memory cell due to threshold voltage shift can be corrected by ECC. ECC operations can include regular ECC operations used to correct errors based only on hard data and advanced ECC operations which can use soft data to correct errors. Whether regular ECC and/or advanced ECC is used can depend on the number of cells that are in error, for instance, e.g., a quantity of erroneous bits.

In a number of embodiments of the present disclosure, ECC operations are performed. User data can be split into 4 portions of user data, an encoding operation is performed on each of the 4 portions. In response to one of the 4 portions of user data failing the LDPC decoding operations, a BCH decoding operation is performed to correct errors on the failed portion of user data. In one or more embodiments, an exclusive OR (XOR) operation is executed on the LDPC codewords. The BCH codeword is based on a result of the XOR operation. Using the LDPC decoding operation as a first ECC operation and only performing a BCH decoding operation in response to 1 in 4 LDPC operations failing can reduce the BCH overhead of the memory system by 4 times.

As illustrated in FIG. 1, a host 102 can be coupled to the memory system 104. Host 102 can be a laptop computer, personal computers, digital camera, digital recording and playback device, mobile telephone, PDA, memory card reader, interface hub, among other host systems, and can include a memory access device, e.g., a processor. One of ordinary skill in the art will appreciate that "a processor" can intend one or more processors, such as a parallel processing system, a number of coprocessors, etc.

In one or more embodiments, a physical host interface can be in the form of a standardized interface. For example, when the memory system 104 is used for data storage in a computing system 100, a physical host interface can be a serial advanced technology attachment (SATA), peripheral component interconnect express (PCIe), or a universal serial bus (USB), among other connectors and interfaces. In general, however, a physical host interface can provide an interface for passing control, address, data, and other signals between the memory system 104 and a host 102 having compatible receptors for the physical host interface.

The controller 108 can communicate with the memory devices 110-1, . . . , 110-N to read, write, and erase data, among other operations. Controller 108 can have circuitry that may be one or more integrated circuits and/or discrete components. A controller could selectively couple an I/O connection (not shown in FIG. 1) of a memory device 110-1, . . . , 110-N to receive the appropriate signal at the appropriate I/O connection at the appropriate time. Similarly, the communication protocol between a host 102 and the memory system 104 may be different than what is required for access of a memory device 110-1, . . . , 110-N. Controller 108 can translate the commands received from a host into the appropriate commands to achieve the desired access to a memory device 110-1, . . . , 110-N.

A memory device 110-1, . . . , 110-N can include one or more arrays of memory cells, e.g., non-volatile memory cells. The arrays can be flash arrays with a NAND architecture, for example. Embodiments are not limited to a particular type of memory device. For instance, the memory device can include RAM, ROM, DRAM, SDRAM, PCRAM, RRAM, and flash memory, among others.

The memory devices 110-1, . . . , 110-N can include a number of memory cells that can be grouped. As used herein, a group can include one or more memory cells, such as a page, block, plane, die, an entire array, or other groups of memory cells. For example, some memory arrays can include a number of pages of memory cells that make up a block of memory cells. A number of blocks can be included in a plane of memory cells. A number of planes of memory cells can be included on a die. As an example, a 128 GB memory device can include 4314 bytes of data per page, 128 pages per block, 2048 blocks per plane, and 16 planes per device.

In a memory device, a physical page can refer to a unit of writing and/or reading, e.g., a number of cells that are written and/or read together or as a functional group of memory cells. An even page and an odd page can be written and/or read with separate writing and/or reading operations.

For embodiments including multilevel cells (MLC), a physical page can be logically divided into, for example, an upper page and a lower page of data. For example, one memory cell can contribute one or more bits to an upper page of data and one or more bits to a lower page of data. Accordingly, an upper page and a lower page of data can be written and/or read as part of one writing and/or reading operation, as the logical upper page and logical lower page are both part of the same physical page.

The embodiment of FIG. 1 can include additional circuitry that is not illustrated so as not to obscure embodiments of the present disclosure. For example, the memory system 104 can include address circuitry to latch address signals provided over I/O connections through I/O circuitry. Address signals can be received and decoded by a row decoder and a column decoder to access the memory devices 110-1, ..., 110-N. It will be appreciated by those skilled in the art that the number of address input connections can depend on the density and architecture of the memory devices 110-1, ..., 110-N.

In general, the controller 108 is responsible for converting command packets received from the host 102, e.g., from a PCIe bus, into command instructions for host-memory translation circuitry and for converting memory responses into host system commands for transmission to the requesting host.

In one or more embodiments, data can be written to the memory devices one page at a time. Each page in the memory device can have a number of physical sectors and each physical sector can be associated with a logical block address (LBA). As an example, a physical page can have 8 physical sectors of data. However, embodiments are not limited to a particular number of physical sectors per physical page.

Figure 2:
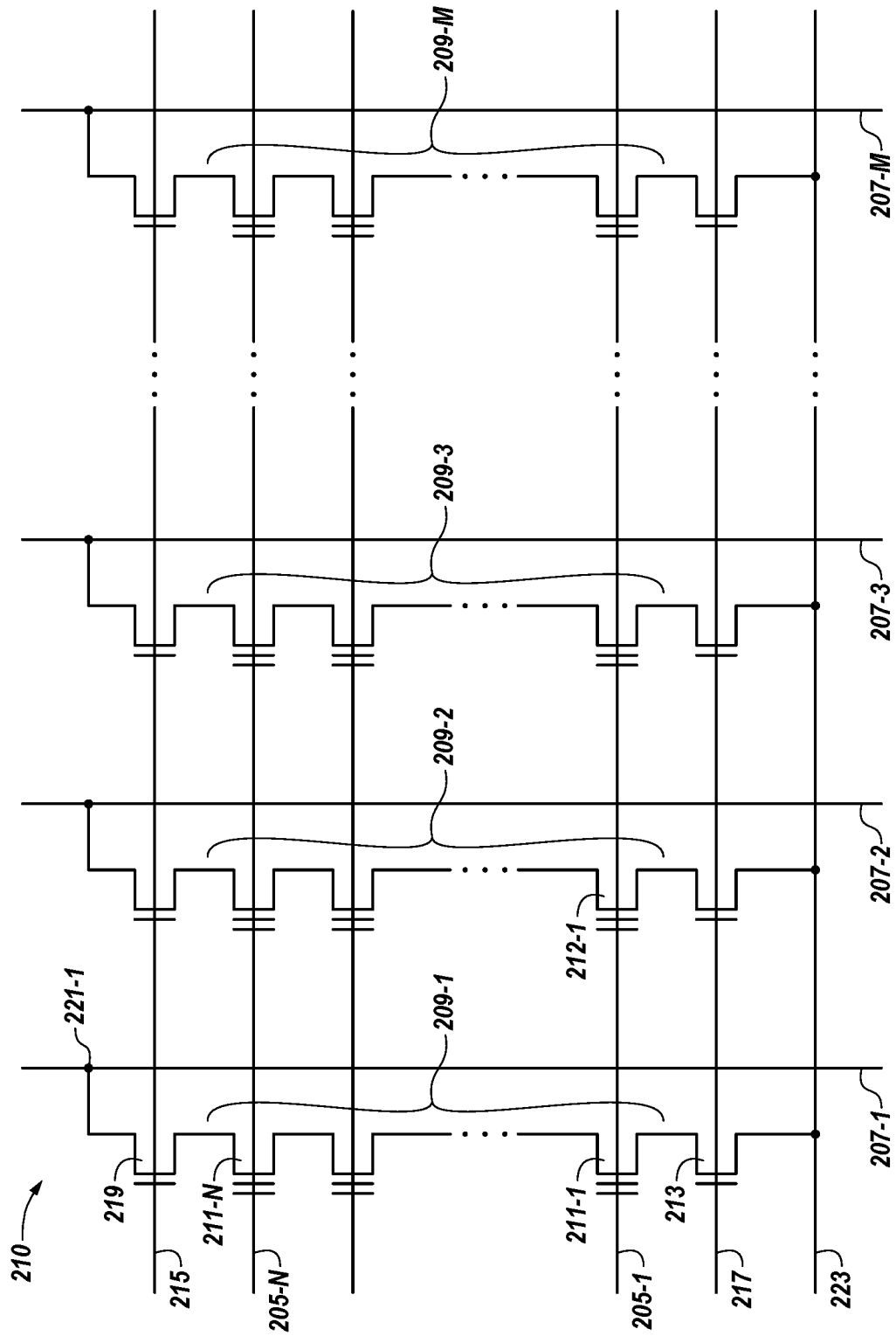
FIG. 2 is a schematic of a portion of memory comprising an array of memory cells operable in accordance with a number of embodiments of the present disclosure.

FIG. 2 is a schematic of a portion of memory 210 comprising an array of memory cells operable in accordance with a number of embodiments of the present disclosure. The embodiment of FIG. 2 illustrates a NAND architecture non-volatile memory array; however, embodiments described herein are not limited to this example. For example, a number of embodiments can implemented to a NOR architecture non-volatile memory array. As shown in FIG. 2, the memory array includes access lines (e.g., word lines 205-1, ..., 205-N) and intersecting data lines (e.g., local bit lines 207-1, 207-2, 207-3, ..., 207-M). For ease of addressing in the digital environment, the number of word lines 205-1, ..., 205-N and the number of local bit lines 207-1, 207-2, 207-3, ..., 207-M can be some power of two (e.g., 256 word lines by 4,096 bit lines).

The memory array includes NAND strings 209-1, 209-2, 209-3, ..., 209-M. Each NAND string includes non-volatile memory cells 211-1, ..., 211-N, each communicatively coupled to a respective word line 205-1, ..., 205-N. Each NAND string (and its constituent memory cells) is also associated with a local bit line 207-1, 207-2, 207-3, ..., 207-M. The memory cells 211-1, ..., 211-N of each NAND string 209-1, 209-2, 209-3, ..., 209-M are coupled in series source to drain between a select gate source (e.g., a field-effect transistor (FET) 213) and a select gate drain (e.g., FET 219). Each select gate source 213 is configured to selectively couple a respective NAND string to a common source 223 responsive to a signal on source select line 217, while each select gate drain 219 is configured to selectively couple a respective NAND string to a respective bit line responsive to a signal on drain select line 215.

As shown in the embodiment illustrated in FIG. 2, a source of select gate source 213 is coupled to a common source line 223. The drain of select gate source 213 is coupled to the source of the memory cell 211-1 of the corresponding NAND string 209-1. The drain of select gate drain 219 is coupled to bit line 207-1 of the corresponding NAND string 209-1 at drain contact 221-1. The source of select gate drain 219 is coupled to the drain of the last memory cell 211-N (e.g., a floating-gate transistor) of the corresponding NAND string 209-1.

In a number of embodiments, construction of the non-volatile memory cells 211-1, ..., 211-N includes a source, a drain, a floating gate or other charge storage structure, and a control gate. The memory cells 211-1, ..., 211-N have their control gates coupled to a word line, 205-1, ..., 205-N, respectively. A NOR array architecture would be similarly laid out, except that the string of memory cells would be coupled in parallel between the select gates. For example, one end of each memory cell (e.g., a memory cell 211-N as illustrated in FIG. 2) can be coupled to a bit line, and another end of the same memory cell can be coupled to a source line that can be aligned in parallel with the bit line. Furthermore, a NOR architecture can provide for random access to the memory cells in the array (e.g., as opposed to page-based access as with a NAND architecture).

In operation, a number of memory cells coupled to a selected word line (e.g., 205-1, ..., 205-N) can be written and/or read together as a group. A group of memory cells written and/or read together can be referred to as a page of cells (e.g., a physical page) and can store a number of pages of data (e.g., logical pages). A number of memory cells coupled to a particular word line and programmed together to respective data states can be referred to as a target page. A programming operation can include applying a number of program pulses (e.g., 16V-20V), which correspond to a particular programming algorithm that is being used to program the memory cell, to a selected word line in order to increase the threshold voltage (Vt) of selected cells coupled to that selected word line to a desired voltage level corresponding to a targeted data state.

Read operations can include sensing a voltage and/or current change of a bit line coupled to a selected cell in order to determine the state of the selected cell. The read operation can include precharging a bit line and sensing the discharge when a selected cell begins to conduct. One type of read operation comprises applying a ramping read signal to a selected word line, and another type of read operation comprises applying a plurality of discrete read signals to the selected word line to determine the states of the cells.

Figure 3:
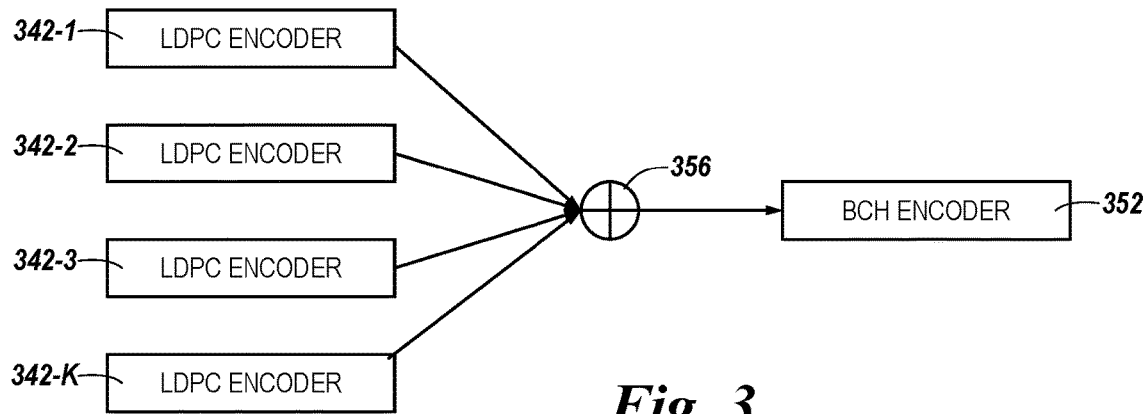
FIG. 3 is a block diagram of a BCH encoder and a number of LDPC encoders in accordance with a number of embodiments of the present disclosure.

FIG. 3 is a functional block diagram of a BCH encoder 352 and a number of LDPC encoders 342-1, ..., 342-K. The BCH encoder 352 and the number of LDPC encoders 342 can be control circuitry found on a controller (e.g. controller 108 in FIG. 1). The BCH encoder generates a BCH codeword based on a number of LDPC codewords. For example, the BCH codeword can be generated by summing the number of LDPC codewords. The BCH codeword can be encoded using an encoded matrix with a column weight of 4. The LDPC codes are generated from a number of LDPC encoders 342-1, ..., 342-K. In one or more embodiments of the current disclosure, 4KB user data can be split into 4 portions of 1KB user data length. Encoding operations are executed on each 1KB portion of user data.

The BCH encoder 352 and the number of LDPC encoders 342-1, ..., 342-$k$ can be used with a write operation. The BCH encoder 352 generates BCH parity bits and the number of LDPC encoders 342-1, ..., 342-$k$ generate LDPC parity bits based on the user data of the write operation. The BCH parity bits and the LDPC parity bits can be stored in memory (e.g. channel memory 110-1, . . . , 110-N in FIG. 1) along with the user data.

Figure 4:
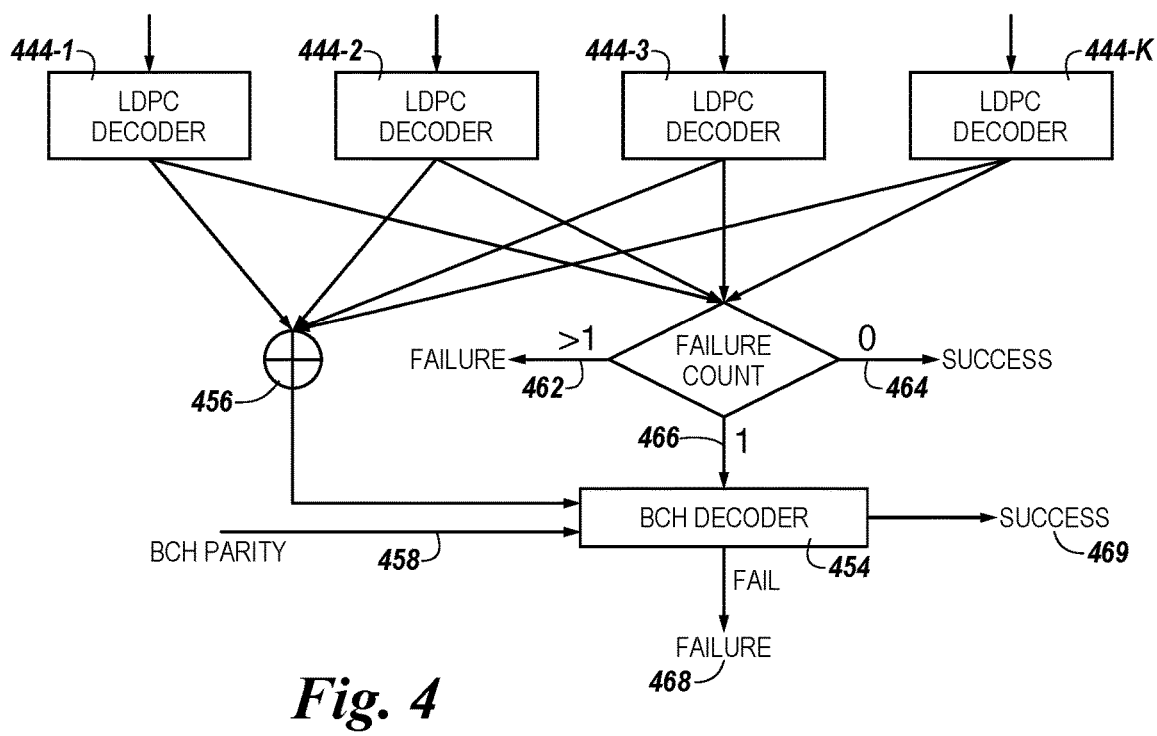
FIG. 4 is a block diagram of a BCH decoder and a number of LDPC decoders in accordance with a number of embodiments of the present disclosure.

FIG. 4 is a functional block diagram of a BCH decoder and a number of LDPC decoders. The BCH decoder 352 and the number of LDPC decoders 342-1, . . . , 342-K can be control circuitry found on a controller (e.g. controller 108 in FIG. 1). In the embodiment illustrated in FIG. 4, a number of LDPC decoding operations are executed on a number of LDPC codewords using the number of LDPC decoders 444-1, . . . , 444-K. In one or more embodiments, min-sum decoding is applied to each of the number of LDPC codewords. Success 464 occurs in response to all of the number of LDPC codewords passing the LDPC decoding operation. Failure 462 occurs in response to two or more of the number of LDPC codewords failing the LDPC. In a number of embodiments, a success message is sent in response to all of the number of LDPC codewords passing the LDPC decoding operation and a failure message is sent in response to two or more of the number of LDPC codewords failing the number of LDPC decoding operations. A BCH decoding operation is executed 466 in response to one of the number of LDPC codewords failing the LDPC decoding operation and a remaining number of LDPC codewords passing the LDPC decoding operation. In one or more embodiments, an exclusive OR (XOR) operation is executed on the number of LDPC codewords. The resulting codeword from the XOR operation is concatenated 456 with the BCH parity bits to generate a BCH codeword. In a number of embodiments of the present disclosure, the BCH decoding operation includes a correction power (t) of ≥8 and ≤12, which can reduce a combined decoding error floor of the number of LDPC decoding operations and the BCH decoding operation.

The BCH decoder 454 executes the BCH decoding operation using the BCH codeword, which is based on the number of LDPC codewords and the BCH parity bits 458. The BCH decoding operation is executed to correct errors associated with an uncorrectable LDPC codeword. Success 469 occurs in response to the uncorrectable LDPC codeword being corrected by the BCH decoding operation. Failure 468 occurs in response to the uncorrectable LDPC codeword failing to be corrected by the BCH decoding operation.

The BCH decoder 454 and the LDPC decoders 444-1, . . . , 444-K can be used in accordance with a read operation. During a read operation the LDPC parity bits created by the LDPC encoders (e.g. LDPC encoder 342-1, . . . , 342-K in FIG. 3) and the LDPC codewords are entered into the number of LDPC decoders. When one of the LPDC codewords fail the LDPC decoding operation, the BCH parity bits created by the BCH encoder (e.g. BCH encoder 352 in FIG. 3) along with the failed LDPC codeword are entered into the BCH decoder 454.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a memory device;
a controller, coupled to the memory device, configured to:
generate a number of low density parity check (LDPC) codewords via a LDPC encoder from user data of a write operation during an encoding operation; and
generate bose-chaudhuri-hocquenghem (BCH) parity bits via a BCH encoder from user data of the write operation during the encoding operation.

2. The apparatus of claim 1, wherein the user data is split into a number of portions and a number of encoding operations are performed on the number of portions.

3. The apparatus of claim 1, wherein the number of LDPC codewords generated is 4.

4. The apparatus of claim 1, wherein an exclusive OR (XOR) operation is executed on the number of LDPC codewords in response to one of the number of LDPC codewords failing an LDPC decoding operation.

5. The apparatus of claim 4, wherein a BCH codeword is based on a result of the XOR operation.

6. The apparatus of claim 1, wherein the controller is configured to execute a BCH decoding operation via a BCH decoder using a BCH codeword based on the number of LDPC codewords and BCH parity bits to correct errors associated with an uncorrectable LDPC codeword of the number of LDPC codewords.

7. An apparatus, comprising:
a memory device;
a controller, coupled to the memory device, configured to:
execute a LDPC decoding operation, wherein the decoding operation includes performing a LDPC decoding operation on each of a number of LDPC codewords;
generate a BCH codeword, based on the number of LDPC codewords and a number of BCH parity bits, in response to one of the number of LDPC codewords failing the LDPC decoding operation; and
perform a BCH decoding operation using the BCH codeword to correct errors associated with an uncorrectable LDPC codeword.

8. The apparatus of claim 7, wherein the LDPC decoding operation includes performing decoding operations on 4 LDPC codewords that are generated.

9. The apparatus of claim 7, wherein each LDPC codeword of the number of LDPC codewords is 1 KB.

10. The apparatus of claim 7, wherein the BCH codeword is 1 KB.

11. The apparatus of claim 7, wherein a success message is sent in response to all of the number of LDPC codewords passing the LDPC decoding operation.

12. The apparatus of claim 7, wherein the BCH codeword is generated by performing an XOR operation on the number of LDPC codewords.

13. The apparatus of claim 12, wherein the BCH codeword is generated by concatenating the result of the XOR operation with the number of BCH parity bits.

14. The apparatus of claim 7, wherein the BCH decoding operation has a correction power of greater than or equal to 8 and less than or equal to 12.

15. A method for performing an error correction code (ECC) operation, comprising:
- executing a number of low density parity check (LDPC) decoding operations on a number of LDPC codewords;
- executing a bose-chaudhuri-hocquenghem (BCH) decoding operation in response to one of the number of LDPC codewords failing the LDPC decoding operation and a remaining number of the number of LDPC codewords passing the LDPC decoding operation, wherein the BCH decoding operation includes:
    - generating a BCH codeword based on the number of LDPC codewords and BCH parity bits based on user data of a write operation; and
    - decoding the BCH codeword using a BCH decoder to correct errors associated with an uncorrectable LDPC codeword.

16. The method of claim 15, wherein the method includes reducing an overall BCH overhead by 4 times.

17. The method of claim 15, wherein the BCH decoding operation includes a correction power of $\geq 8$ and $\leq 12$.

18. The method of claim 15, wherein executing the BCH decoding operation includes using a BCH codeword with at most 14 bits and a number of BCH parity bits that are at most 14 times a correction power of the BCH decoding operation.

19. The method of claim 15, wherein the method includes the number of LDPC decoding operations being concatenated with a t-correcting BCH decoding operation.

20. The method of claim 19, wherein concatenating the t-correcting BCH code with the number of LDPC decoding operations, a combined decoding error floor of the number of LDPC decoding operations and BCH decoding operations is reduced.

* * * * *